US012804916B2

(12) United States Patent
Luo et al.

(10) Patent No.: US 12,804,916 B2
(45) Date of Patent: Nov. 17, 2026

(54) THIN FILM RESISTOR (TFR) WITH OXIDATION PREVENTION

(71) Applicant: Taiwan Semiconductor Manufacturing Company, Ltd., Hsinchu (TW)

(72) Inventors: Guanyu Luo, Chiayi County (TW); Chung-Liang Cheng, Changhua County (TW); Sheng-Chau Chen, Tainan (TW)

(73) Assignee: Taiwan Semiconductor Manufacturing Company, Ltd., Hsinchu (TW)

( * ) Notice: Subject to any disclaimer, the term of this patent is extended or adjusted under 35 U.S.C. 154(b) by 743 days.

(21) Appl. No.: 18/171,277

(22) Filed: Feb. 17, 2023

(65) Prior Publication Data

US 2024/0282806 A1 Aug. 22, 2024

(51) Int. Cl.
*H10D 1/47* (2025.01)
*H10W 20/40* (2026.01)

(52) U.S. Cl.
CPC .......... *H10D 1/474* (2025.01); *H10W 20/498* (2026.01)

(58) Field of Classification Search
CPC ............................ H10D 1/474; H01L 23/5228
See application file for complete search history.

(56) References Cited

U.S. PATENT DOCUMENTS 5,340,775 A * 8/1994 Carruthers .......... H01L 23/5256 257/E23.149
5,804,869 A * 9/1998 Hadizad ................ H01L 23/564 257/632
6,703,666 B1 * 3/2004 Huttemann ............ H10D 1/474 257/E27.047
6,849,512 B1 * 2/2005 Lo ..................... H01L 21/28238 438/770
2006/0027526 A1 * 2/2006 Vialpando ............ H01C 17/075 216/13
2006/0145286 A1 * 7/2006 Ohkawa ............. H10D 84/0181 257/E21.639
2006/0183250 A1 * 8/2006 Choi ...................... H10B 53/30 257/E21.59
2007/0032034 A1 * 2/2007 Arao ........................ H10D 1/68 257/E21.648
2007/0298551 A1 * 12/2007 Bouvet .................. B82Y 10/00 216/2
2010/0136764 A1 * 6/2010 Dirnecker ......... H01L 21/76843 257/E21.004
2011/0128692 A1 * 6/2011 Gaul ...................... H10D 1/692 257/536
2015/0123118 A1 * 5/2015 Yeom ..................... H10D 64/62 257/43
2017/0256505 A1 * 9/2017 Takizawa ............ H01L 23/5228
2022/0271118 A1 * 8/2022 Jerome .................. H01C 7/006
2023/0352518 A1 * 11/2023 Jerome .................. H10D 1/474

* cited by examiner

*Primary Examiner* — Kyung S Lee

(74) *Attorney, Agent, or Firm* — Kilpatrick Townsend & Stockton LLP

(57) ABSTRACT

A thin film resistor (TFR) is provided. The thin film resistor includes: a first insulator layer; a silicon chromium (SiCr) thin film disposed on the first insulator layer, an oxidation prevention layer disposed on the SiCr thin film; and a first contact structure and a second contact structure disposed on the oxidation prevention layer. The oxidation prevention layer is operable to prevent the SiCr thin film from being oxidized during a wet etching process.

20 Claims, 9 Drawing Sheets

THIN FILM RESISTOR (TFR) WITH OXIDATION PREVENTION

FIELD

Embodiments of the present disclosure relate generally to thin film resistors (TFRs), and more particularly to TFRs with oxidation prevention.

BACKGROUND

The semiconductor industry has experienced rapid growth due to ongoing improvements in the integration density of a variety of electronic components (e.g., transistors, diodes, resistors, capacitors, etc.). For the most part, improvement in integration density has resulted from iterative reduction of minimum feature size, which allows more components to be integrated into a given area. There is always a need to improve the performance of semiconductor devices.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION OF THE INVENTION

Figure 1:
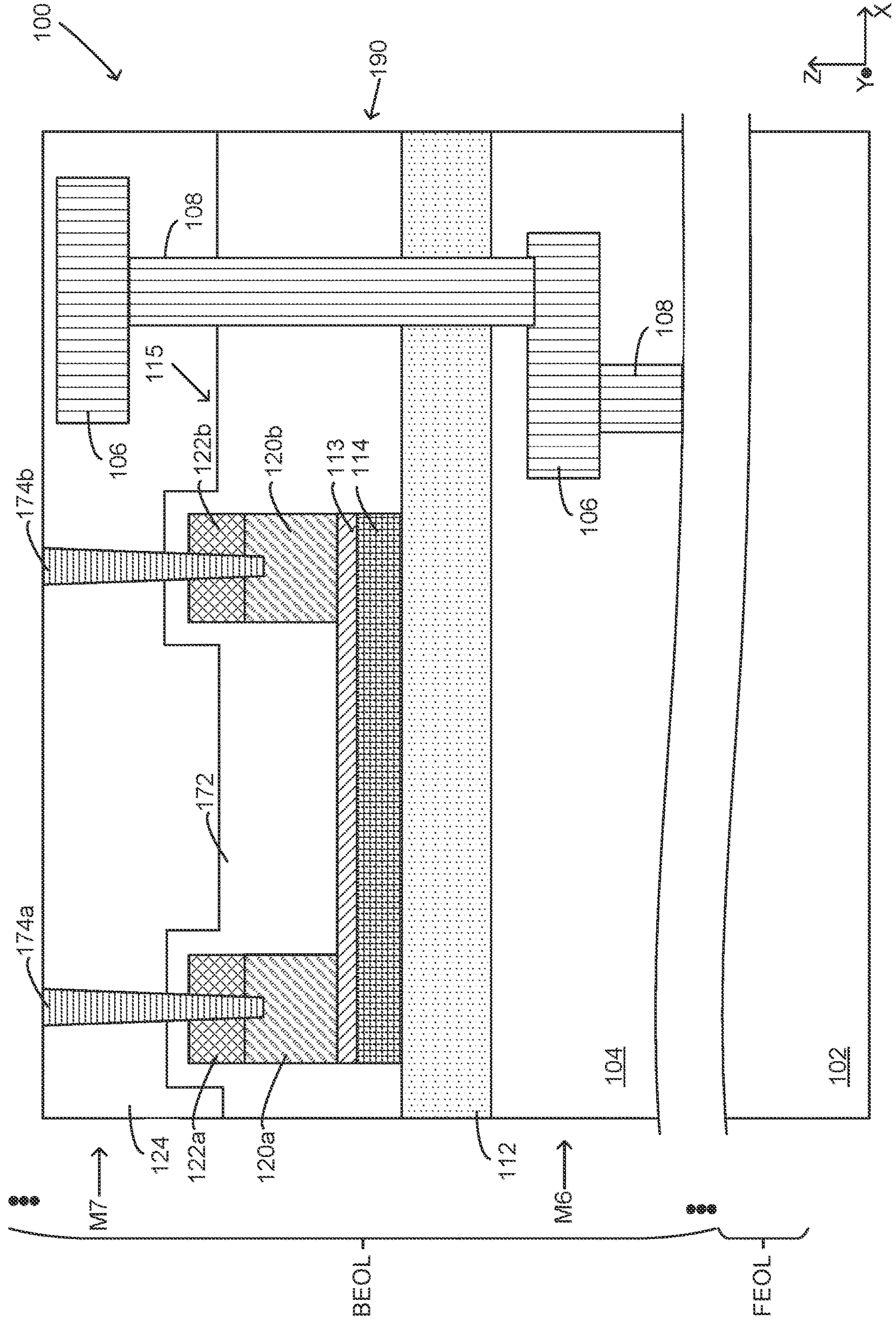
FIG. 1 is a diagram illustrating an example integrated circuit (IC) in accordance with some embodiments.

The following disclosure provides many different embodiments, or examples, for implementing different features of the subject matter provided. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

In addition, source/drain region(s) may refer to a source or a drain, individually or collectively dependent upon the context. For example, a device may include a first source/drain region and a second source/drain region, among other components. The first source/drain region may be a source region, whereas the second source/drain region may be a drain region, or vice versa. One of ordinary skill in the art would recognize many variations, modifications, and alternatives.

Some embodiments of the disclosure are described. Additional operations can be provided before, during, and/or after the stages described in these embodiments. Some of the stages that are described can be replaced or eliminated for different embodiments. Some of the features described below can be replaced or eliminated and additional features can be added for different embodiments. Although some embodiments are discussed with operations performed in a particular order, these operations may be performed in another logical order.

Overview

Integrated circuits (ICs) typically include passive devices in addition to active devices. The passive devices may, for example, include inductors, resistors, capacitors, and the like. One common type of resistors used in an IC is a polysilicon resistor. However, the polysilicon resistor may face a number of issues. For example, by virtue of the material of polysilicon resistors, the temperature coefficient of resistance (TCR) of the polysilicon resistor is relatively high (e.g., about 990 ppm/° C.). This in turn may result in a change in resistance of the polysilicon resistor over time, especially in high voltage applications, where a relatively large amount of heat may accumulate in the polysilicon resistor due to the high voltage used. Further, the relatively high TCR may result in a low breakdown voltage, thereby resulting in device failure of the IC.

A thin film resistor (TFR) is a resistor that is made of a thin film of a resistive material disposed on, for example, a dielectric layer on a substrate. A thin film resistor is typically fabricated using deposition processes. Examples of resistive materials include silicon chromium (SiCr, sometimes also referred to as "chromium silicide" or "chromium monosilicide"), nickel chromium (NiCr, sometimes also referred to as "NICHROME"), and tantalum nitride (TaN), among other examples, because these resistive materials exhibit stability and desired resistivity properties. TFRs are attractive components for applications such as high precision analog and mixed signal applications, and the like.

SiCr is an inorganic compound of chromium and silicon. SiCr is a metal with an electrical resistivity of $2\times10^{-4}$ Ω·cm. A reduced TCR (e.g., lower than about 50 ppm/° C.) can be achieved by using SiCr as the resistive material. Therefore, a change in resistance due to heat may be mitigated.

In a conventional fabrication process, a SiCr thin film resistor is fabricated by evaporating or sputtering SiCr onto a dielectric layer to form a SiCr thin film. A conductive layer comprising, for example, titanium nitride (TiN) and a dielectric cap layer is subsequently formed on the SiCr thin film, thereby forming a stack of the SiCr thin film, the conductive layer, and the dielectric cap layer. After the stack is patterned and etched, the conductive layer and the dielectric cap layer are patterned and etched to form the contact structures for electrical connection of the SiCr thin film resistor. The exposed region of the conductive layer and the dielectric cap layer is etched using, for example, a dry etching process (e.g., a plasma etching process) in a first stage and a subsequent wet etching process in a second stage. The wet etching process, instead of a dry etching process, is used in the second stage to avoid damage to the SiCr thin film caused by plasma during the dry etching process.

However, there is a problem associated with the wet etching process. The wet etching process is typically a hydrogen peroxide ($H_2O_2$) wet etching process, and $H_2O_2$ tends to react with the exposed SiCr thin film. As a result, a top portion of the SiCr thin film is oxidized, forming an oxidation layer. The presence of the oxidation layer contributes to an increased sheet resistance. The oxidation layer further results in the variation in the effective thickness of the SiCr thin film (i.e., thicker at certain regions and thinner at other regions). The compromised thickness uniformity contributes to a compromised uniformity in the sheet resistance of the SiCr thin film resistor. For example, when variation range of the effective thickness of the SiCr thin film increases from 2.09 angstroms to 3.48 angstroms, the uniformity in the sheet resistance of the SiCr thin film resistor increase from 2.9% to 4.2%. It should be understood that this uniformity exists not only within one wafer but also across different wafers.

In accordance with some aspects of the disclosure, a thin film resistor is provided. The thin film resistor includes, among other components, a SiCr thin film disposed on a first insulator layer, an oxidation prevention layer disposed on the SiCr thin film, and a first contact structure and a second contact structure disposed on the oxidation prevention layer. The oxidation prevention layer is formed in situ after the SiCr thin film is formed. The oxidation prevention layer is operable to prevent the SiCr thin film from being oxidized during a wet etching process.

In one embodiment, the oxidation prevention layer is a silicon-containing layer. As a result, the silicon-containing layer may react with $H_2O_2$ during the $H_2O_2$ wet etching process to form silicon oxide ($SiO_x$). In another embodiment, the oxidation prevention layer 113 is a metal nitride layer. As a result, the metal nitride layer may react with $H_2O_2$ during the $H_2O_2$ wet etching process to form metal oxide. Thus, the top portion of the SiCr thin film is not oxidized, and an oxidation layer is prevented. The variation in the effective thickness of the SiCr thin film can be reduced significantly. The improved thickness uniformity contributes to an improved uniformity in the sheet resistance of the thin film resistor.

Details of the thin film resistor and these benefits will be described below with references to FIGS. 1 to 5.

Example Integrated Circuit Including a Thin Film Resistor with Oxidation Prevention FIG. 1 is a diagram illustrating an example IC 100 in accordance with some embodiments. FIG. 1 is not drawn to scale. In the example shown in FIG. 1, the IC 100 includes, among other components, a substrate 102, a multilayer interconnect (MLI) structure 190 on the substrate 102, and a thin film resistor 115 disposed in the MLI structure 190. Active devices (e.g., transistors) are disposed in the substrate 102 and fabricated using front-end-of-line (FEOL) of fabrication. The MLI structure 190 is disposed on the substrate 102 and is fabricated using back-end-of-line (BEOL) of fabrication. The thin film resistor 115 is disposed in the MLI structure and fabricated using BEOL of fabrication. Although only one thin film resistor 115 is shown in FIG. 1, it should be understood that the number of thin film resistors 115 may vary in various embodiments. For example, tens, hundreds, or even thousands of thin film resistors 115 may be fabricated using BEOL of fabrication in a complex IC 100.

The MLI structure 190 includes a combination of dielectric layers and conductive layers configured to form various interconnect structures. The conductive layers are configured to form vertical interconnect features 108 (e.g., device-level contacts, vias, etc.) and horizontal interconnect features 106 (e.g., conductive lines extending in a horizontal plane). Vertical interconnect features 108 typically connect horizontal interconnect features 106 in different layers (e.g., a sixth metal layer often denoted as "M6" and a seventh metal layer often denoted as "M7," as shown in FIG. 1) of the MLI structure 190. During operation of the IC 100, the interconnect structures are configured to route or distribute signals (e.g., clock signals, voltage signals, ground signals) to the active devices and the passive devices in the IC 100 to fulfill certain functions. It should be understood that although the MLI structure 190 is depicted in FIG. 1 with a given number of dielectric layers and conductive layers, the present disclosure contemplates MLI structures having more or fewer dielectric layers and/or conductive layers depending on design requirements of the IC 100.

In the example shown in FIG. 1, the MLI structure 190 includes, among other components, a first inter-level dielectric (ILD) structure 104 and a second ILD structure 124. The first ILD structure 104 corresponds to the sixth metal layer (i.e., the "M6" layer shown in FIG. 1) in this example; the second ILD structure 124 corresponds to the seventh metal layer (i.e., the "M7" layer shown in FIG. 1) in this example. It should be understood that the first ILD structure 104 and the second ILD structure 124 may correspond to other metal layers in other embodiments.

A first insulator layer 112 is disposed on the first ILD structure 104 and separates the first ILD structure 104 and the thin film resistor 115 in the vertical direction (i.e., the Z-direction shown in FIG. 1). In the example shown in FIG. 1, the thin film resistor 115 is disposed on the first insulator layer 112. In some embodiments, the thin film resistor 115 may be used as a component of, for example, resistor-capacitor (RC) circuits, power drivers, power amplifiers, radio frequency (RF) applications, analog to digital converters (ADCs), and digital to analog converters (DACs).

In the example shown in FIG. 1, the thin film resistor 115 includes, among other components, a SiCr thin film 114, an oxidation prevention layer 113, a first contact structure 120*a*, a second contact structure 120*b*, a first dielectric cap structure 122*a*, and a second dielectric cap structure 122*b*. It should be understood that the thin film resistor 115 may include other components in other embodiments. One of ordinary skill in the art would recognize many variations, modifications, and alternatives.

In the example shown in FIG. 1, the oxidation prevention layer 113 is disposed on the SiCr thin film 114. As will be discussed in detail below, the oxidation prevention layer 113 is formed in situ on the SiCr thin film 114 after the SiCr thin film 114 is formed on the first insulator layer 112. The oxidation prevention layer 113 is operable to prevent the SiCr thin film 114 from being oxidized during the $H_2O_2$ wet etching process where $H_2O_2$ tends to react with the region of the SiCr thin film 114 that is exposed.

In one embodiment, the oxidation prevention layer 113 is a silicon-containing layer. As a result, the silicon-containing layer may react with $H_2O_2$ during the $H_2O_2$ wet etching process to form silicon oxide ($SiO_x$). Thus, the top portion of the SiCr thin film 114 is not oxidized, and an oxidation layer is prevented. The variation in the effective thickness of the SiCr thin film 114 can be reduced significantly. The improved thickness uniformity contributes to an improved uniformity in the sheet resistance of the thin film resistor 115.

In one example, the oxidation prevention layer 113 comprises silicon. In another example, the oxidation prevention layer 113 comprises silicide. In still another example, the oxidation prevention layer 113 comprises silicon nitride. In yet another example, the oxidation prevention layer 113 is a silicon-rich SiCr layer. The silicon-rich SiCr layer is characterized by an atomic percentage of silicon no smaller than 60% and below 100%. The silicon-rich SiCr layer may be a graded silicon-rich SiCr layer characterized by a graded atomic percentage of silicon along the Z-direction. The silicon-rich SiCr layer may also be characterized by a constant atomic percentage of silicon along the Z-direction (i.e., nongraded).

In another embodiment, the oxidation prevention layer 113 is a metal nitride layer. As a result, the metal nitride layer may react with $H_2O_2$ during the $H_2O_2$ wet etching process to form metal oxide. Thus, the top portion of the SiCr thin film 114 is not oxidized, and an oxidation layer is prevented. The variation in the effective thickness of the SiCr thin film 114 can be reduced significantly. The improved thickness uniformity contributes to an improved uniformity in the sheet resistance of the thin film resistor 115.

In one example, the oxidation prevention layer 113 comprises tantalum nitride (TaN). In another example, the oxidation prevention layer 113 comprises tungsten nitride (WN). In yet another example, the oxidation prevention layer 113 comprises chromium nitride (CrN).

In the example shown in FIG. 1, a second insulator layer 172 covers the first insulator layer 112 and the thin film resistor 115. The first insulator layer 112 and the second insulator layer 172 encapsulate the thin film resistor 115. The first insulator layer 112 and the second insulator layer 172 may be operable to dissipate the heat generated by the SiCr thin film 114 during the operation of the thin film resistor.

In the example shown in FIG. 1, a first contact via **174*a* penetrates through the second ILD structure 124, the second insulator layer 172, and the first dielectric cap structure 122*a* and is in contact with the first contact structure 120*a*. As such, the first contact structure 120*a* is electrically connected to the first contact via 174*a*, which can be further electrically connected to other components of the IC 100. Likewise, the second contact via 174*b* penetrates through the second ILD structure 124, the second insulator layer 172, and the second dielectric cap structure 122*b* and is in contact with the second contact structure 120*b*. As such, the second contact structure 120*b* is electrically connected to the second contact via 174*b*, which can be further electrically connected to other components of the IC 100**.

Example Process Flow

Figure 2:
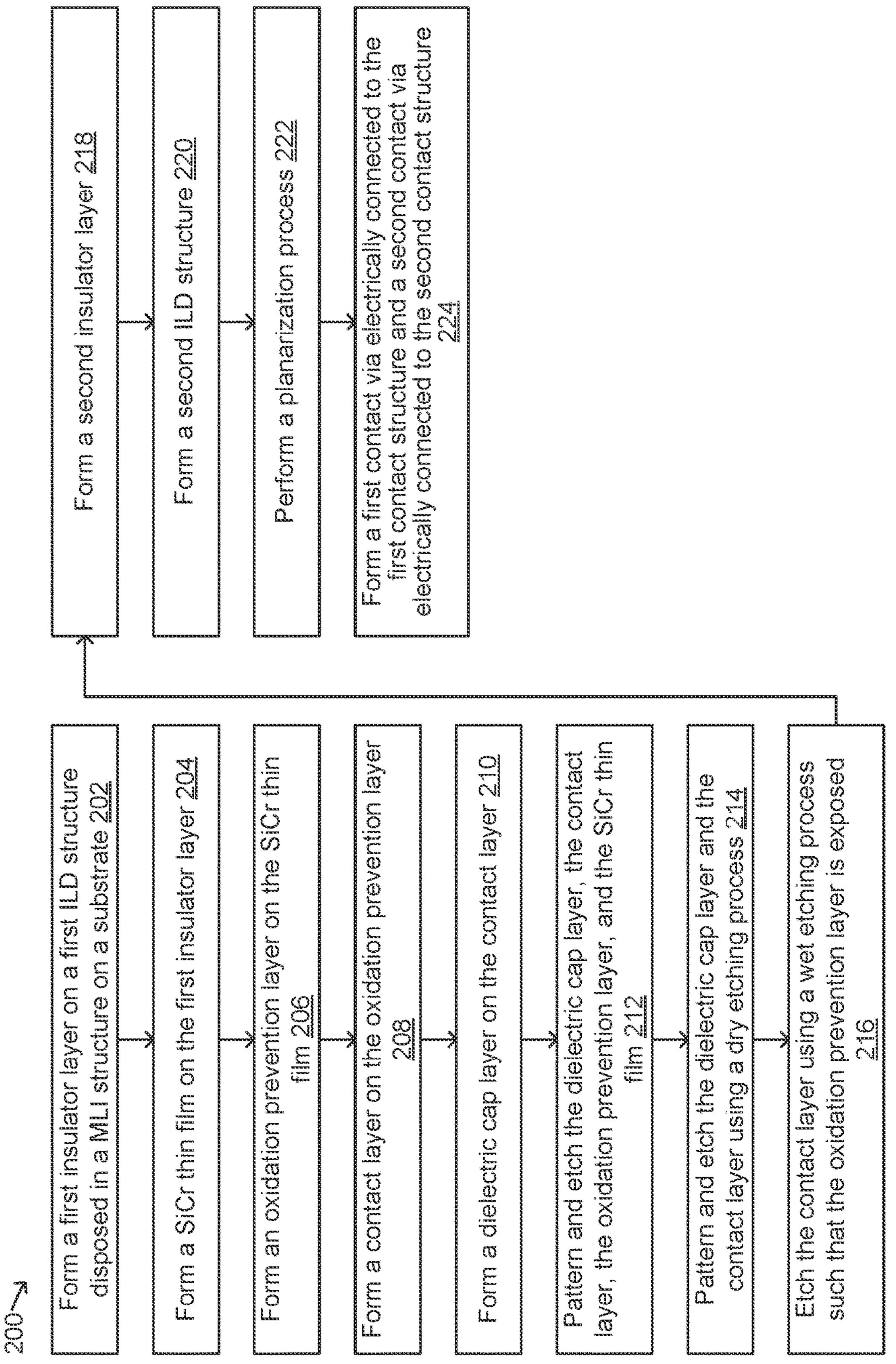
FIG. 2 is a flowchart diagram illustrating an example method for fabricating an IC including an example thin film resistor in accordance with some embodiments.

FIG. 2 is a flowchart diagram illustrating an example method 200 for fabricating an IC including an example thin film resistor in accordance with some embodiments. In the example shown in FIG. 2, the method 200 includes operations 202, 204, 206, 208, 210, 212, 214, 216, 218, 220, 222, and 224. Additional operations may be performed. Also, it should be understood that the sequence of the various operations discussed above with reference to FIG. 2 is provided for illustrative purposes, and as such, other embodiments may utilize different sequences. These various sequences of operations are to be included within the scope of embodiments. FIGS. 3A-3E are cross-sectional views of a portion of the IC at various stages of fabrication in accordance with some embodiments. FIGS. 3A-3E are not drawn to scale.

The method 200 starts with operation 202. At operation 202, a first insulator layer is formed on a first ILD structure disposed in a MLI structure on a substrate. In some embodiments, the substrate may, for example, be a bulk substrate (e.g., a bulk silicon substrate), a silicon-on-insulator (SOI) substrate, or some other suitable substrates.

The MLI structure is fabricated on the substrate using BEOL of fabrication, as explained above. The MLI structure includes multiple ILD structures, each corresponding to a metal layer (e.g., the sixth metal layer or the seventh metal layer).

The first ILD structure is one of these multiple ILD structures and may, for example, be formed by chemical vapor deposition (CVD), physical vapor deposition (PVD), atomic layer deposition (ALD), plasma enhanced CVD (PECVD), thermal oxidation, or another suitable growth or deposition process. As discussed above, vertical interconnect features and horizontal interconnect features can be formed in the first ILD structure in some embodiments.

In some embodiments, the first insulator layer may comprise a silicon-containing dielectric layer. In one example, the first insulator layer comprises undoped silicate glass (USG). In another example, the first insulator layer comprises phosphosilicate glass (PSG). In another example, the first insulator layer comprises borosilicate glass (BSG). In yet another example, the first insulator layer comprises borophosphosilicate glass (BPSG). It should be understood that these examples are not intended to be limiting, and other suitable silicon-containing dielectric materials characterized by a smaller dielectric constant than that of the silicon dioxide can be used in other embodiments. The first insulator layer may, for example, be formed by CVD, PVD, ALD, plasma enhanced CVD (PECVD), thermal oxidation, or another suitable growth or deposition process.

Figure 3A:
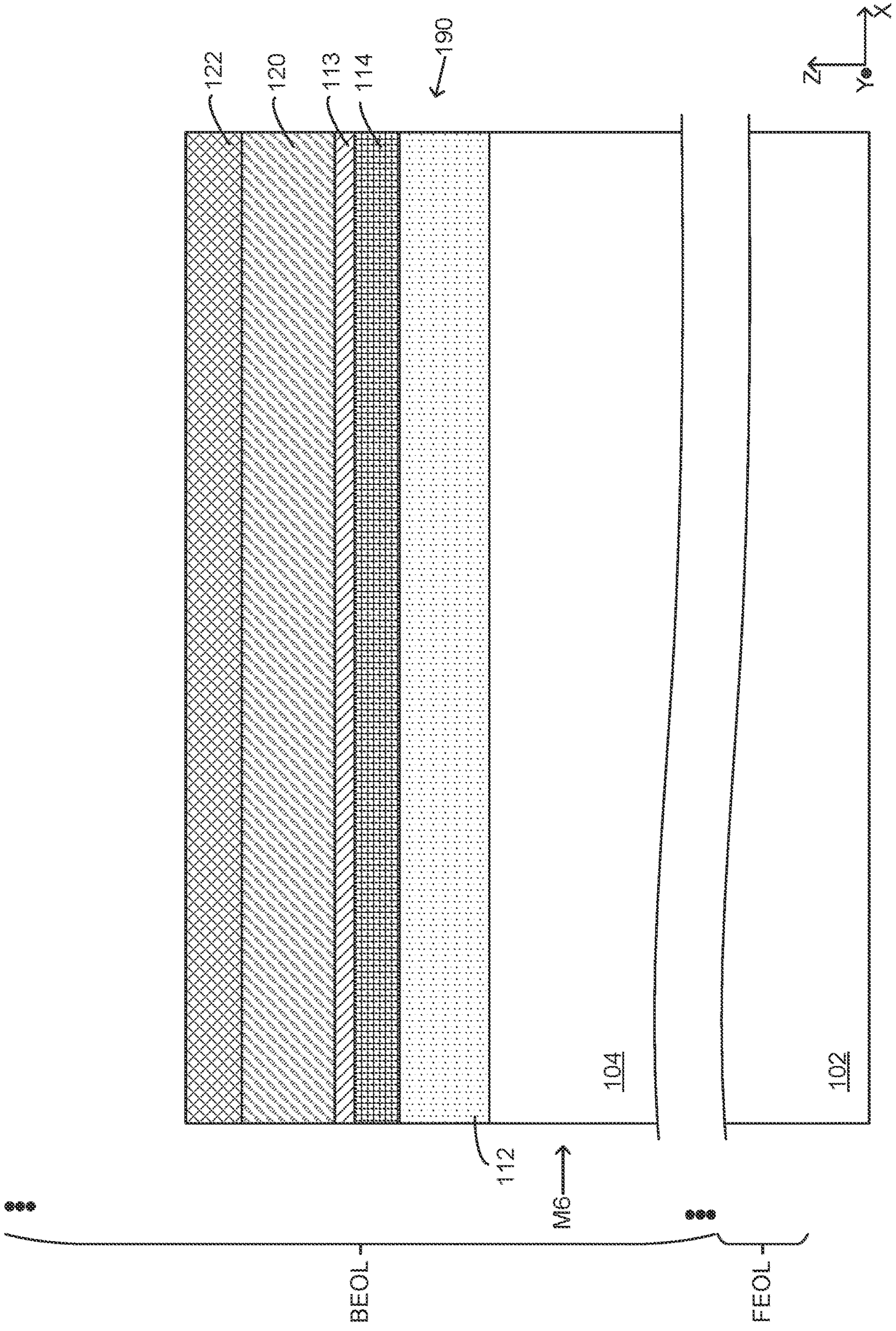
FIGS. 3A-3E are cross-sectional views of a portion of the IC at various stages of fabrication in accordance with some embodiments.

In the example shown in FIG. 3A, the first insulator layer 112 is formed on the first ILD structure 104. The first ILD structure 104 is part of the MLI structure 190. The MLI structure 190 is formed on the substrate 102.

At operation 204, a SiCr thin film is formed on the first insulator layer. In one implementation, the SiCr thin film is formed by PVD. In other implementations, the SiCr thin film is formed by CVD, ALD, PECVD, or another suitable growth or deposition process. Although a SiCr thin film is used as an example, it should be understood that the techniques disclosed may be applied to other resistive thin films. Examples of these resistive thin films include, but are not limited to, a NiCr thin film and a TaN thin film. In the example shown in FIG. 3A, the SiCr thin film 114 is formed on the first insulator layer 112. In one embodiment, the SiCr thin film 114 is characterized by a thickness between 60 angstroms and 65 angstroms in the Z-direction. In one example, the SiCr thin film 114 is characterized by a thickness of 63.3 angstroms in the Z-direction.

At operation 206, an oxidation prevention layer is formed on the SiCr thin film. In one implementation, the oxidation prevention layer is formed by PVD. In another implementation, the oxidation prevention layer is formed by PVD. In yet another implementation, the oxidation prevention layer is formed by ALD. It should be understood that other suitable growth or deposition processes may be employed in other implementations.

As discussed above, in one embodiment, the oxidation prevention layer 113 is a silicon-containing layer. In one example, the oxidation prevention layer 113 comprises silicon. In another example, the oxidation prevention layer 113 comprises silicide. In still another example, the oxidation prevention layer 113 comprises silicon nitride. In yet another example, the oxidation prevention layer 113 is a silicon-rich SiCr layer. The silicon-rich SiCr layer is characterized by an atomic percentage of silicon no smaller than 60% and below 100%. The silicon-rich SiCr layer may be a graded silicon-rich SiCr layer characterized by a graded atomic percentage of silicon along the Z-direction. The silicon-rich SiCr layer may also be characterized by a constant atomic percentage of silicon along the Z-direction (i.e., nongraded).

In another embodiment, the oxidation prevention layer 113 is a metal nitride layer. In one example, the oxidation prevention layer 113 comprises tantalum nitride (TaN). In another example, the oxidation prevention layer 113 comprises tungsten nitride (WN). In yet another example, the oxidation prevention layer 113 comprises chromium nitride (CrN).

In the example shown in FIG. 3A, the oxidation prevention layer 113 is formed on the SiCr thin film 114. In one embodiment, the oxidation prevention layer 113 is characterized by a thickness between 10 angstroms and 50 angstroms in the Z-direction. In another embodiment, the oxidation prevention layer 113 is characterized by a thickness between 10 angstroms and 30 angstroms in the Z-direction. In yet another embodiment, the oxidation prevention layer 113 is characterized by a thickness between 10 angstroms and 20 angstroms in the Z-direction. In one example, the oxidation prevention layer 113 is characterized by a thickness of 10 angstroms in the Z-direction. It should be understood that the contribution of the oxidation prevention layer 113 to the resistance is acceptable because the oxidation prevention layer 113 is relatively thin (as thin as 10 angstroms in some examples), and the material (e.g., a silicon-containing material) of the oxidation prevention layer 113 is close to SiCr.

At operation 208, a contact layer is formed on the oxidation prevention layer. The contact layer will subsequently be patterned and etched to form two contact structures (e.g., the first contact structure 120*a* and the second contact structure 120*b* shown in FIG. 1), as will be discussed below. In one implementation, the contact layer is formed by PVD. In other implementations, the contact layer is formed by CVD, ALD, PECVD, or another suitable growth or deposition process.

In one embodiment, the contact layer comprises titanium nitride (TiN). In another embodiment, the contact layer comprises tantalum nitride (TaN). It should be understood that the contact layer may comprise other suitable conductive materials in other embodiments.

In the example shown in FIG. 3A, the contact layer 120 is formed on the oxidation prevention layer 113. In one embodiment, the contact layer 120 is characterized by a thickness between 550 angstroms and 650 angstroms in the Z-direction. In one example, the contact layer 120 is characterized by a thickness of 600 angstroms in the Z-direction.

At operation 210, a dielectric cap layer is formed on the contact layer. The dielectric cap layer will subsequently be patterned and etched to form two dielectric cap structures (e.g., the first dielectric cap structure 122*a* and the second dielectric cap structure 122*b* shown in FIG. 1), as will be discussed below. In one implementation, the dielectric cap layer is formed by CVD. In other implementations, the contact layer is formed by PVD, ALD, PECVD, or another suitable growth or deposition process.

In one embodiment, the dielectric cap layer comprises silicon oxynitride ($SiO_xN_y$). In another embodiment, the dielectric cap layer comprises silicon oxycarbide ($SiO_xC_y$). It should be understood that the dielectric cap layer may comprise other suitable dielectric materials in other embodiments.

In the example shown in FIG. 3A, the dielectric cap layer 122 is formed on the contact layer 120. In one embodiment, the dielectric cap layer 122 is characterized by a thickness between 300 angstroms and 350 angstroms in the Z-direction. In one example, the dielectric cap layer 122 is characterized by a thickness of 320 angstroms in the Z-direction.

At operation 212, the dielectric cap layer, the contact layer, the oxidation prevention layer, and the SiCr thin film are patterned and etched. The stack of the dielectric cap layer, the contact layer, the oxidation prevention layer, and the SiCr thin film are patterned and etched to define the region of the thin film resistor. It should be understood that the etching process may include multiple processes to etch these layers sequentially using different etchants. In some implementations, the etching process is a dry etching process.

Figure 3B:
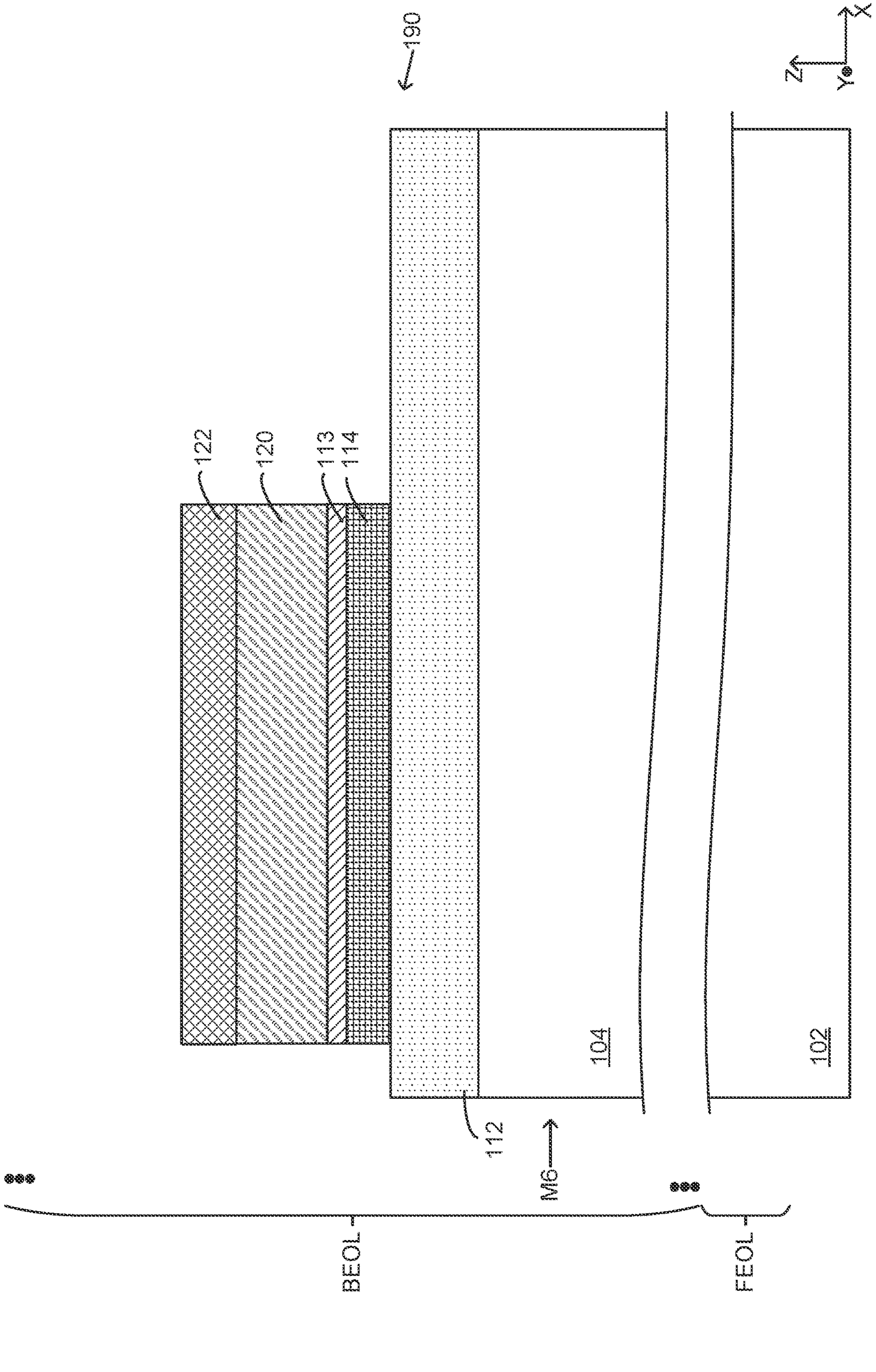

In the example shown in FIG. 3B, the unexposed region of the stack of the dielectric cap layer 122, the contact layer 120, the oxidation prevention layer 113, and the SiCr thin film 114 remain after the etching process. The region of the thin film resistor is, therefore, defined.

At operation 214, the dielectric cap layer and the contact layer is patterned and etched using a dry etching process. The dielectric cap layer is patterned and etched to define two dielectric cap structures (e.g., the first dielectric cap structure 122*a* and the second dielectric cap structure 122*b* shown in FIG. 1). The contact layer is etched to form two contact structures (e.g., the first contact structure 120*a* and the second contact structure 120*b* shown in FIG. 1). The dry etching process, however, stops before the entire thickness of the contact layer in the Z-direction is etched. In other words, a smaller thickness of the contact layer remains in the exposed region, and the oxidation prevention layer is not exposed. In some implementations, the dry etching process is a reactive-ion etching (RIE) process.

Figure 3C:
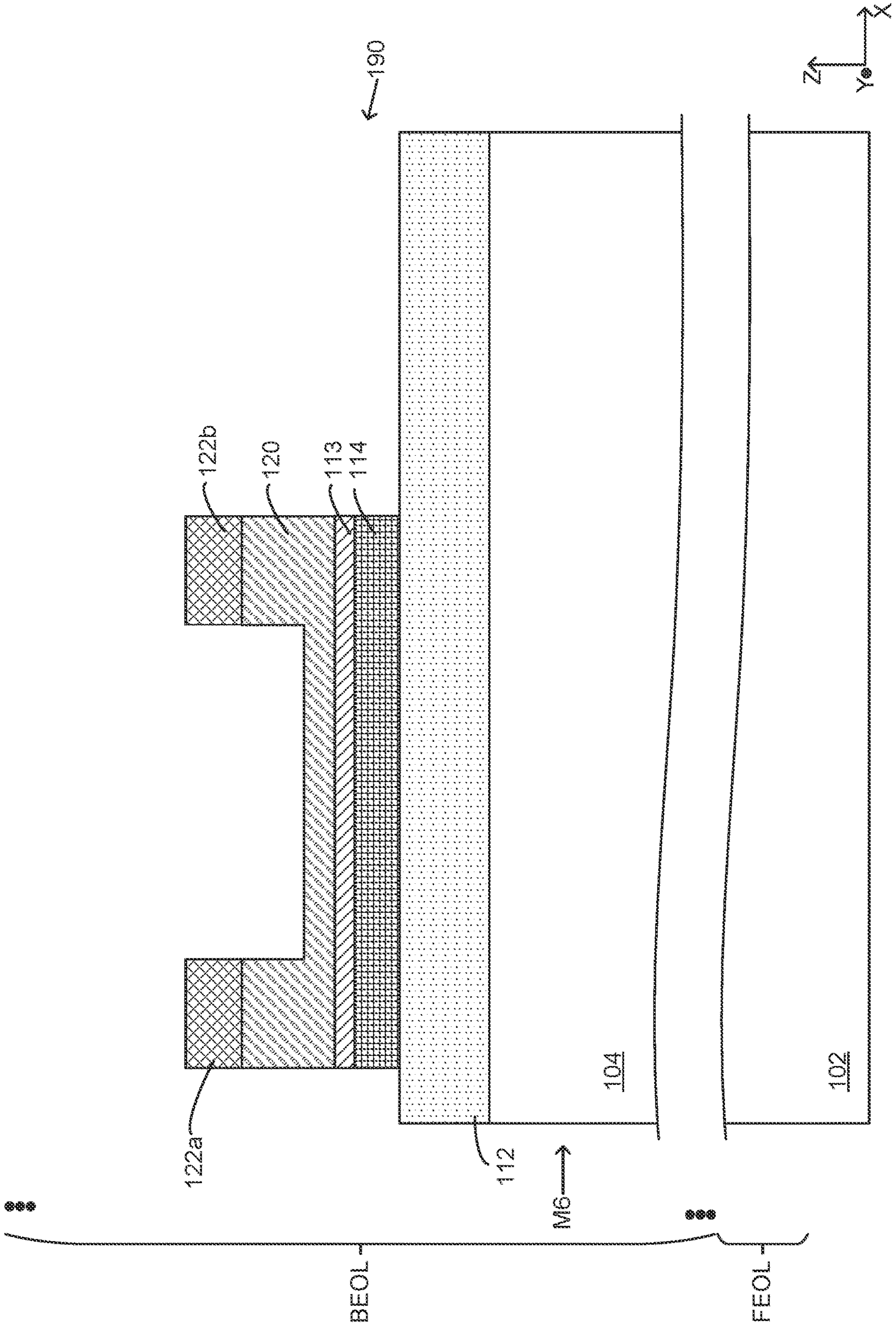

In the example shown in FIG. 3C, the first dielectric cap structure 122*a* and the second dielectric cap structure 122*b* are formed, and a portion of the contact layer 120 in the exposed region (i.e., the region that is not covered by the first dielectric cap structure 122*a* and the second dielectric cap structure 122*b*) is etched. As a result, the oxidation prevention layer 113 is not exposed. In one example, the contact layer 120 is characterized by an entire thickness of 600 angstroms in the Z-direction before the dry etching process, and the remaining thickness is about 300 angstroms after the dry etching process.

At operation 216, the contact layer is etched using a wet etching process such that the oxidation prevention layer is exposed. The dielectric cap structures (the first dielectric cap structure 122*a* and the second dielectric cap structure 122*b* shown in FIG. 1) and the portion of the contact layer that is covered by the dielectric cap structures serve as a mask during the wet etching process. The contact layer in the exposed region is etched, thereby exposing the oxidation prevention layer. Two contact structures (e.g., the first contact structure 120*a* and the second contact structure 120*b* shown in FIG. 1) are formed. In one embodiment, the etchant used in the wet etching process is $H_2O_2$.

Figure 3D:
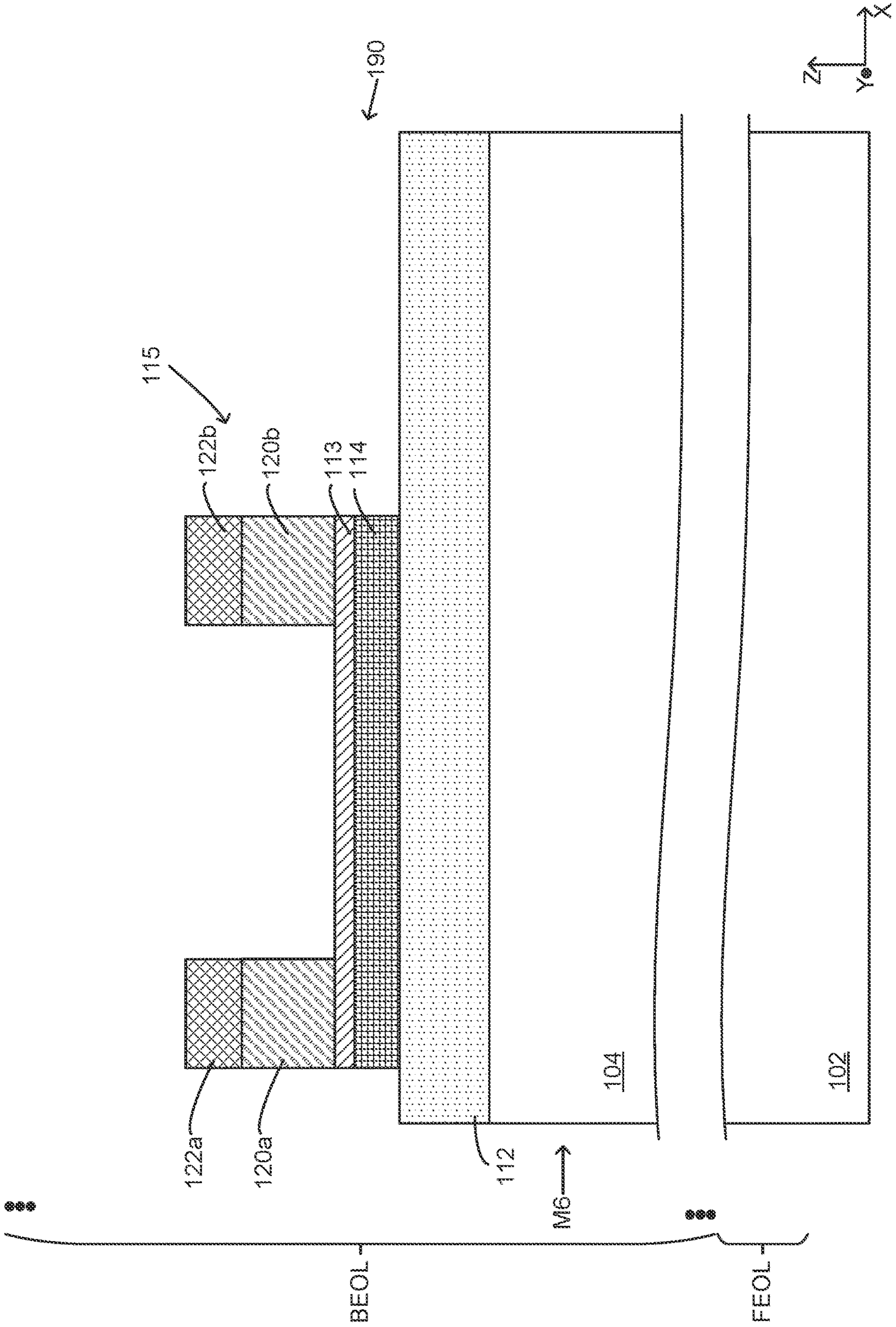

In the example shown in FIG. 3D, the first contact structure 120*a* and the second contact structure 120*b* are formed, and the oxidation prevention layer 113 in the exposed region is exposed. As such, the thin film resistor 115 is fabricated.

As explained above, the oxidation prevention layer 113 is operable to prevent the SiCr thin film 114 from being oxidized during the wet etching process where the etchant (e.g., $H_2O_2$) tends to react with the region of the SiCr thin film 114 that is exposed in a conventional situation.

In one embodiment, the oxidation prevention layer 113 is a silicon-containing layer. As a result, the silicon-containing layer may react with the etchant (e.g., $H_2O_2$) during the wet etching process to form silicon oxide ($SiO_x$). Thus, the top portion of the SiCr thin film 114 is not oxidized, and an oxidation layer is prevented. The variation in the effective thickness of the SiCr thin film 114 can be reduced significantly. The improved thickness uniformity contributes to an improved uniformity in the sheet resistance of the thin film resistor 115.

In another embodiment, the oxidation prevention layer 113 is a metal nitride layer. As a result, the metal nitride layer may react with the etchant (e.g., $H_2O_2$) during the wet etching process to form metal oxide. Thus, the top portion of the SiCr thin film 114 is not oxidized, and an oxidation layer is prevented. The variation in the effective thickness of the SiCr thin film 114 can be reduced significantly. The improved thickness uniformity contributes to an improved uniformity in the sheet resistance of the thin film resistor 115.

At operation 218, a second insulator layer is formed. The second insulator layer covers the first insulator layer and the thin film resistor. The first insulator layer and the second insulator layer may be operable to dissipate the heat generated by the SiCr thin film during the operation of the thin film resistor.

In some embodiments, the second insulator layer may comprise a silicon-containing dielectric layer. In one example, the second insulator layer comprises silicon dioxide. In one example, the second insulator layer comprises USG. In another example, the second insulator layer comprises PSG. In another example, the second insulator layer comprises BSG. In yet another example, the second insulator layer comprises BPSG. It should be understood that these examples are not intended to be limiting, and other suitable silicon-containing dielectric materials characterized by a smaller dielectric constant than that of the silicon dioxide can be used in other embodiments. The second insulator layer may, for example, be formed by CVD, PVD, ALD, PECVD, thermal oxidation, or another suitable growth or deposition process.

Figure 3E:
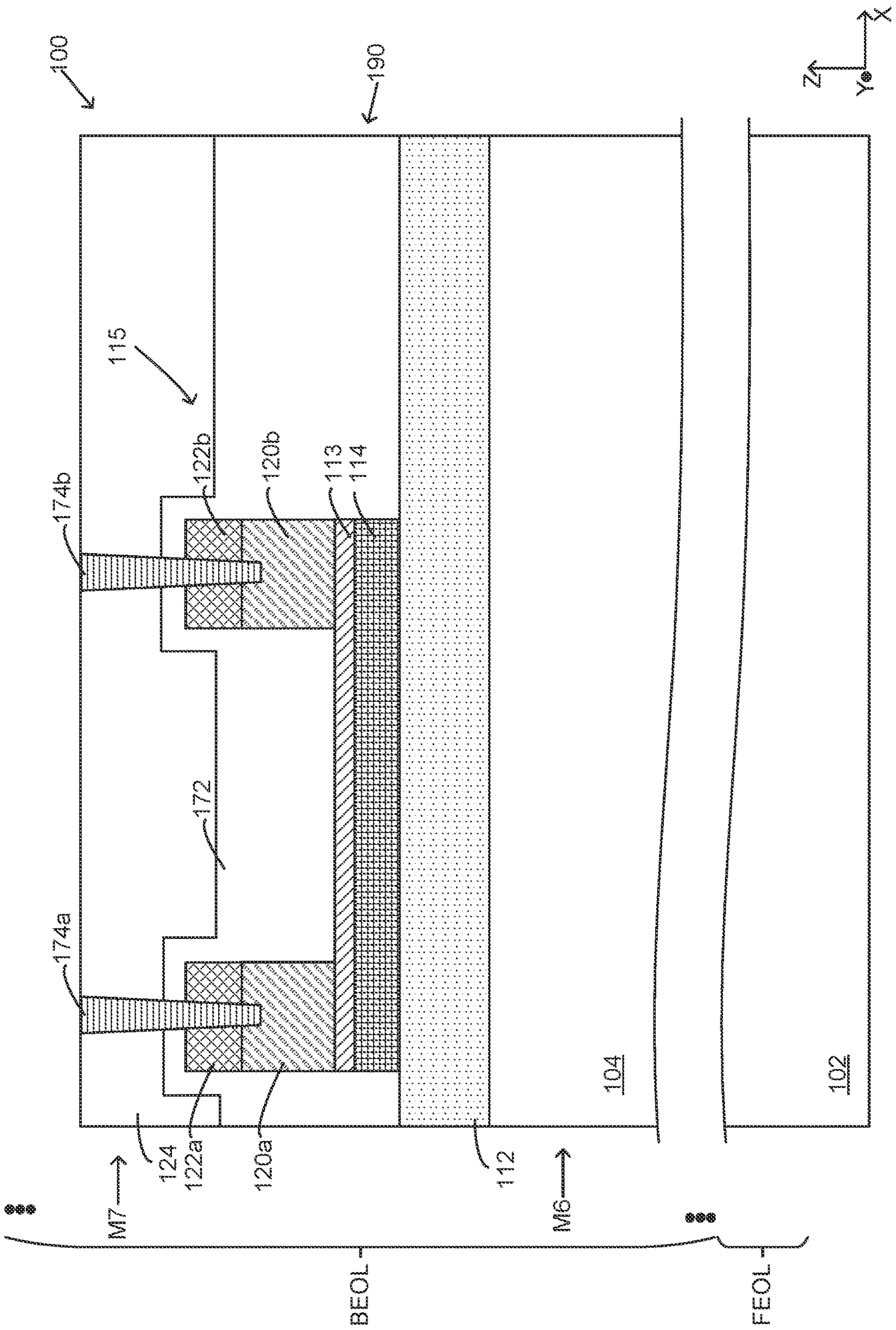

In the example shown in FIG. 3E, the second insulator layer 172 is formed. The second insulator layer 172 covers the first insulator layer 112 and the thin film resistor 115. In the example shown in FIG. 3E, the first insulator layer 112 and the second insulator layer 172 encapsulate the thin film resistor 115.

At operation 220, a second ILD structure is formed. Like the first ILD structure, the second ILD structure is also one of these multiple ILD structures of the MLI structure. The second ILD structure may, for example, be formed by CVD, PVD, ALD, PECVD, thermal oxidation, or another suitable growth or deposition process. As discussed above, vertical interconnect features and horizontal interconnect features can be formed in the second ILD structure in some embodiments.

In the example shown in FIG. 3E, the second ILD structure 124 is formed. The second ILD structure 124 corresponds to the seventh metal layer. The first ILD structure 104 and the second ILD structure are part of the MLI structure 190.

At operation 222, a planarization process is performed. The top surface of the second ILD structure becomes substantially flat after the planarization process. In one implementation, the planarization process is a chemical-mechanical polishing (CMP) process. In the example shown in FIG. 3E, the top surface of the second ILD structure 124 becomes substantially flat.

At operation 224, a first contact via and a second contact via are formed. The first contact via penetrates through the second ILD structure, the second insulator layer, the first dielectric cap structure and is in contact with the first contact structure. As such, the first contact structure is electrically connected to the first contact via, which can be further electrically connected to other components of the IC. Likewise, the second contact via penetrates through the second ILD structure, the second insulator layer, the second dielectric cap structure and is in contact with the second contact structure. As such, the second contact structure is electrically connected to the second contact via, which can be further electrically connected to other components of the IC. The first contact via and the second contact via are formed using CVD, PVD, sputtering, electroplating, electroless plating, or another suitable growth or deposition process, followed by a planarization process (e.g., a CMP process).

In the example shown in FIG. 3E, the first contact via 174*a* and the second contact via 174*b* extend in the Z-direction. The first contact via 174*a* is in contact with the first contact structure 120*a*, and the first contact structure 120*a* may be electrically connected to other components through the first contact via 174*a*. The second contact via 174*b* is in contact with the second contact structure 120*b*, and the second contact structure 120*b* may be electrically connected to other components through the second contact via 174*b*.

In one embodiment, each of the first contact via 174*a* and the second contact via 174*b* includes a liner formed in the sidewalls of the openings formed for the first contact via 174*a* and the second contact via 174*b*, respectively. The liners may serve as isolation liners such that the first contact via 174*a* and the second contact via 174*b* are electrically isolated from neighboring structures. In some embodiments, the liners comprise tetra-ethyl-ortho-silicate (TEOS) (e.g., plasma enhanced TEOS, low particle TEOS, and the like). In other embodiments, the liners comprise an oxide (e.g., silicon oxide, silicon dioxide, and the like), a nitride, another suitable dielectric material, or any combination thereof. The first contact via 174*a* and the second contact via 174*b* comprise a conductive material, such as aluminum (Al), copper (Cu), tungsten (W), and the like.

Figure 4:
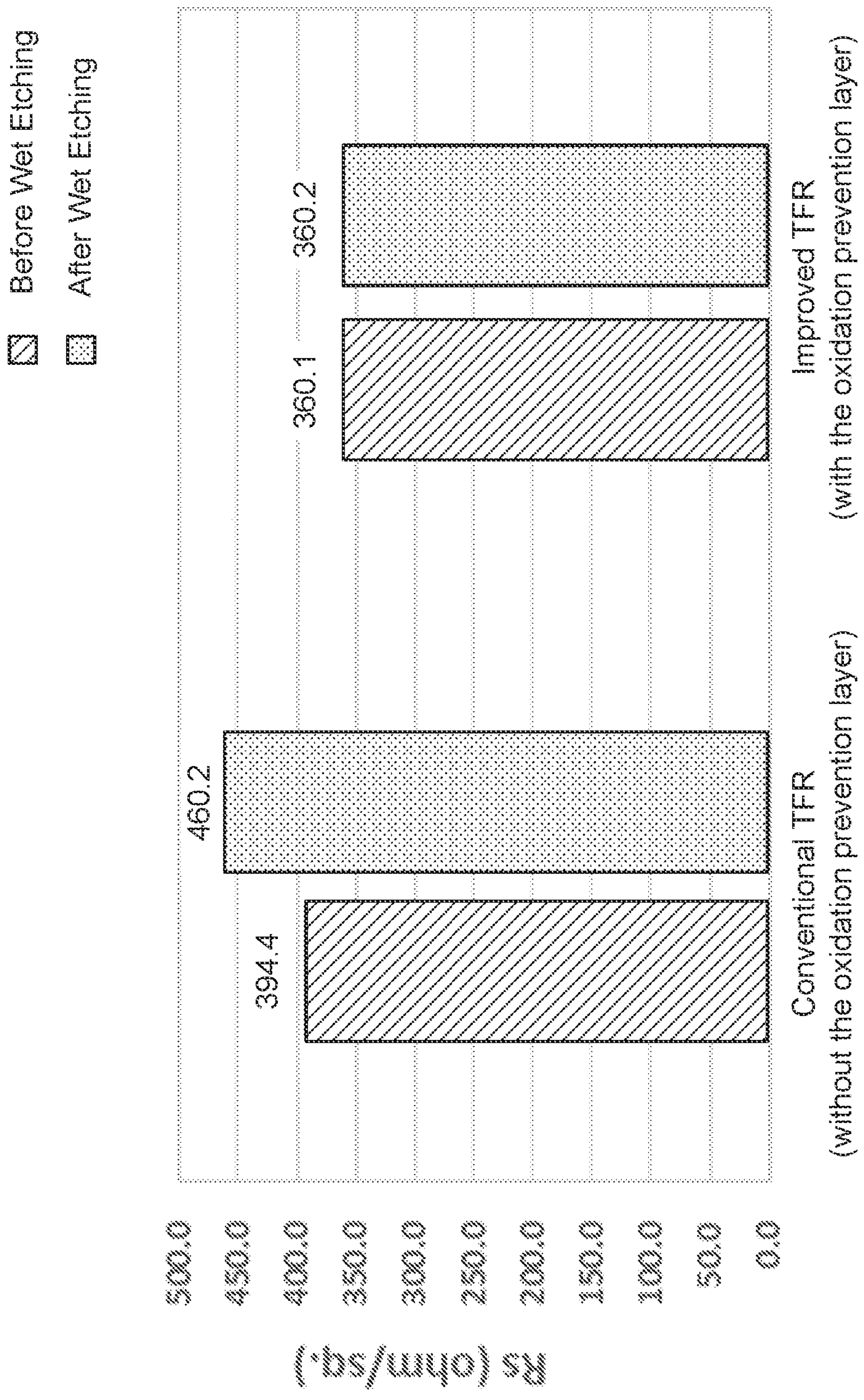
FIG. 4 is a diagram illustrating improved sheet resistance of an example thin film resistor in accordance with some embodiments.

Improved Uniformity in the Sheet Resistance of the Example Thin Film Resistor FIG. 4 is a diagram illustrating improved sheet resistance of an example thin film resistor in accordance with some embodiments. The conventional thin film resistor (without the oxidation prevention layer) and the improved thin film resistor (with the oxidation prevention layer) are compared.

In the example shown in FIG. 4, the conventional thin film resistor is characterized by a thickness of the SiCr thin film that is about 63.3 angstroms, and the improved thin film resistor is characterized by a thickness of the SiCr thin film that is about 63.3 angstroms and a thickness of the oxidation prevention layer that is about 10 angstroms.

For the conventional thin film resistor, the sheet resistance increases from about 394.4 ohms per square (denoted as "ohm/sq") to 460.2 ohms per square after the wet etching process. In other words, the sheet resistance increases by about 16.7%. As explained above, the sheet resistance increases because the presence of the oxidation layer formed during the wet etching process contributes to the increased sheet resistance.

In contrast, for the improved thin film resistor, the sheet resistance increases from about 360.1 ohms per square to 360.2 ohms per square after the wet etching process. In other words, the sheet resistance is almost unchanged. As explained above, the presence of the oxidation prevention layer is operable to prevent the formation of the oxidation layer during the wet etching process. As a result, the sheet resistance is improved.

Figure 5:
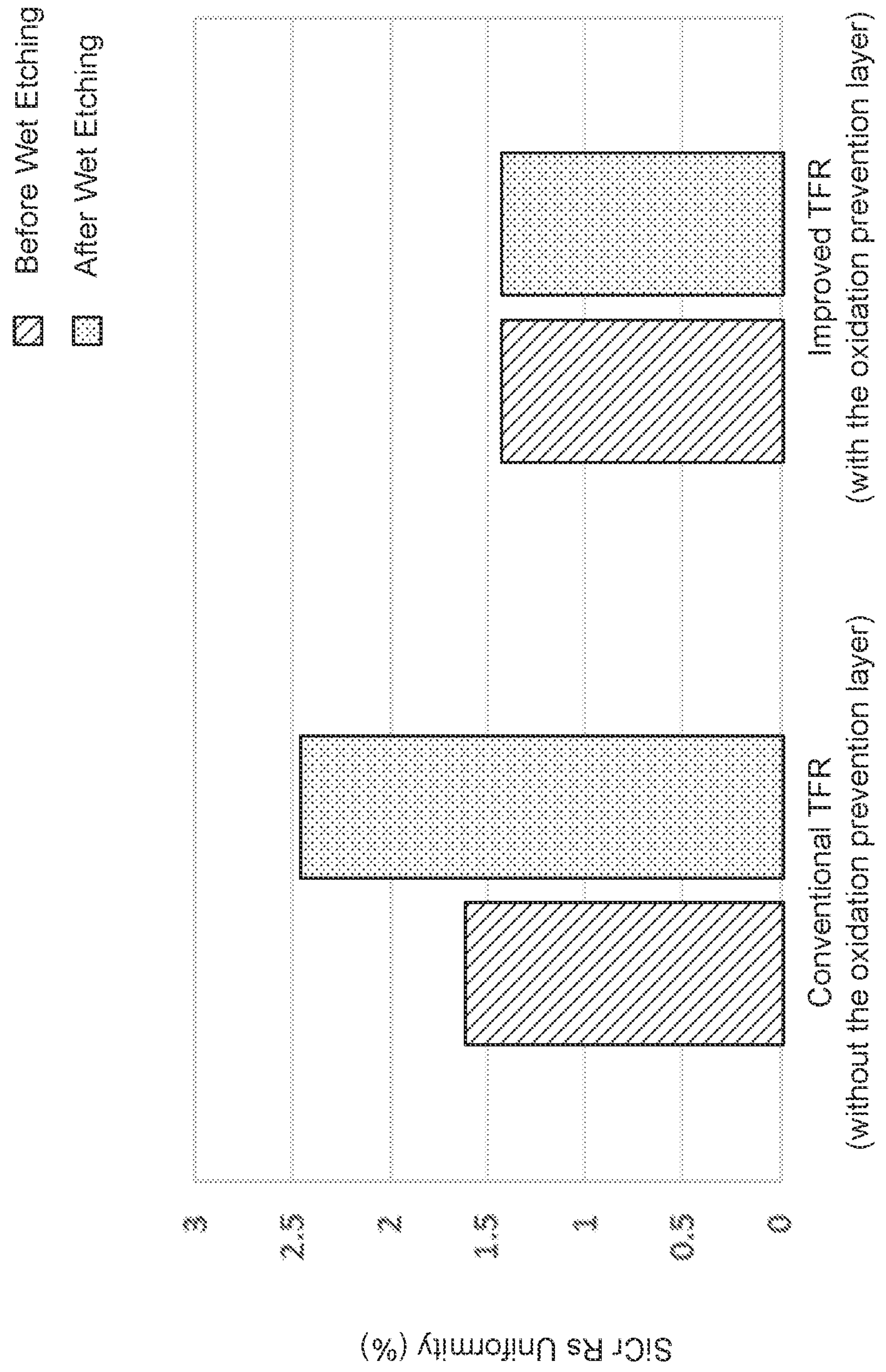
FIG. 5 is a diagram illustrating improved sheet resistance uniformity of an example thin film resistor in accordance with some embodiments.

FIG. 5 is a diagram illustrating improved sheet resistance uniformity of an example thin film resistor in accordance with some embodiments. The conventional thin film resistor (without the oxidation prevention layer) and the improved thin film resistor (with the oxidation prevention layer) are compared. In the example shown in FIG. 5, the conventional thin film resistor is characterized by a thickness of the SiCr thin film that is about 63.3 angstroms, and the improved thin film resistor is characterized by a thickness of the SiCr thin film that is about 63.3 angstroms and a thickness of the oxidation prevention layer that is about 10 angstroms.

For the conventional thin film resistor, the sheet resistance uniformity increases (i.e., becomes worse) from about 1.6% to 2.5% after the wet etching process. In other words, the sheet resistance uniformity deteriorates by about 56.3%. As explained above, the oxidation layer formed during the wet etching process results in the variation in the effective thickness of the SiCr thin film, which further contributes to a compromised sheet resistance uniformity.

In contrast, for the improved thin film resistor, the sheet resistance uniformity remains almost unchanged. As explained above, the presence of the oxidation prevention layer is operable to prevent the formation of the oxidation layer during the wet etching process. As a result, the sheet resistance uniformity is improved (e.g., almost unchanged).

SUMMARY

In accordance with some aspects of the disclosure, a thin film resistor (TFR) is provided. The thin film resistor includes: a first insulator layer; a silicon chromium (SiCr) thin film disposed on the first insulator layer; an oxidation prevention layer disposed on the SiCr thin film; and a first contact structure and a second contact structure disposed on the oxidation prevention layer. The oxidation prevention layer is operable to prevent the SiCr thin film from being oxidized during a wet etching process.

In accordance with some aspects of the disclosure, a method is provided. The method includes the following operations: forming a first insulator layer on a first inter-level dielectric (ILD); forming a silicon chromium (SiCr) thin film on the first insulator layer; forming an oxidation prevention layer on the SiCr thin film, the oxidation prevention layer being operable to prevent the SiCr thin film from being oxidized during a wet etching process; forming a contact layer on the oxidation prevention layer; forming a dielectric cap layer on the contact layer; patterning and etching the dielectric cap layer, the contact layer, the oxidation prevention layer, and the SiCr thin film; patterning and etching, using a dry etching process, the dielectric cap layer and the contact layer to form a first dielectric cap structure and a second dielectric cap structure; and etching, using the wet etching process, the contact layer to form a first contact structure and a second contact structure such that the oxidation prevention layer is exposed.

In accordance with some aspects of the disclosure, an integrated circuit (IC) is provided. The integrated circuit includes: a substrate; a multilayer interconnect (MLI) structure disposed on the substrate; and a thin film resistor disposed in the MLI structure. The thin film resistor includes: a first insulator layer; a silicon chromium (SiCr) thin film disposed on the first insulator layer; an oxidation prevention layer disposed on the SiCr thin film, wherein the oxidation prevention layer is operable to prevent the SiCr thin film from being oxidized during a wet etching process; and a first contact structure and a second contact structure disposed on the oxidation prevention layer.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A thin film resistor (TFR), comprising:
- a first insulator layer;
- a silicon chromium (SiCr) thin film disposed on the first insulator layer;
- an oxidation prevention layer disposed on the SiCr thin film; and
- a first contact structure and a second contact structure disposed on the oxidation prevention layer; and
- wherein the oxidation prevention layer separates the SiCr thin film from the first contact structure and is operable to prevent the SiCr thin film from being oxidized during a wet etching process.

2. The thin film resistor of claim 1, wherein the oxidation prevention layer is a silicon-containing layer.

3. The thin film resistor of claim 2, wherein the oxidation prevention layer comprises silicon.

4. The thin film resistor of claim 2, wherein the oxidation prevention layer comprises silicide.

5. The thin film resistor of claim 2, wherein the oxidation prevention layer comprises silicon nitride.

6. The thin film resistor of claim 2, wherein the oxidation prevention layer is a silicon-rich SiCr layer.

7. The thin film resistor of claim 6, wherein the silicon-rich SiCr layer is characterized by an atomic percentage of silicon no smaller than 60% and below 100%.

8. The thin film resistor of claim 6, wherein the silicon-rich SiCr layer is a graded silicon-rich SiCr layer characterized by a graded atomic percentage of silicon along a vertical direction.

9. The thin film resistor of claim 1, wherein the oxidation prevention layer is a metal nitride layer.

10. The thin film resistor of claim 1, wherein the oxidation prevention layer is characterized by a thickness between 10 angstroms and 50 angstroms.

11. The thin film resistor of claim 10, wherein the thickness is 10 angstroms.

12. The thin film resistor of claim 1, wherein the oxidation prevention layer is formed in situ after the SiCr thin film is formed.

13. The thin film resistor of claim 1, further comprising:
   a first dielectric cap structure disposed on the first contact structure; and
   a second dielectric cap structure disposed on the second contact structure.

14. An integrated circuit (IC) comprising:
   a substrate;
   a multilayer interconnect (MLI) structure disposed on the substrate; and
   a thin film resistor disposed in the MLI structure, the thin film resistor comprising:
      a first insulator layer;
      a silicon chromium (SiCr) thin film disposed on the first insulator layer;
      an oxidation prevention layer disposed on the SiCr thin film, wherein the oxidation prevention layer is operable to prevent the SiCr thin film from being oxidized during a wet etching process; and
      a first contact structure and a second contact structure disposed on the oxidation prevention layer,
      wherein the SiCr thin film and the first contact structure are separated by the oxidation prevention layer.

15. The IC of claim 14, wherein the thin film resistor further comprises:
   a second insulator layer, wherein the first insulator layer and the second insulator layer encapsulate the silicon chromium (SiCr) thin film, the oxidation prevention layer, the first contact structure, and the second contact structure.

16. The IC of claim 14, wherein the oxidation prevention layer comprises one of:
   tantalum nitride (TaN);
   tungsten nitride (WN); and
   chromium nitride (CrN).

17. A thin film resistor (TFR), comprising:
   a first insulator layer;
   a silicon chromium (SiCr) thin film on the first insulator layer;
   an oxidation prevention layer on the SiCr thin film;
   a first contact structure and a second contact structure on the oxidation prevention layer;
   a first dielectric cap structure on the first contact structure and a second dielectric cap structure on the second contact structure; and
   a second insulator layer encapsulating the SiCr thin film, the oxidation prevention layer, the first contact structure, the second contact structure, the first dielectric cap structure, and the second dielectric cap structure,
   wherein the oxidation prevention layer is a silicon-rich SiCr layer.

18. The TFR of claim 17, wherein the first contact structure is sandwiched between the oxidation prevention layer and the first dielectric cap structure.

19. The TFR of claim 18, wherein the silicon-rich SiCr layer characterized by an atomic percentage of silicon of at least 60%.

20. The TFR of claim 17, wherein the oxidation prevention layer comprises a metal nitride selected from the group consisting of tantalum nitride (TaN), tungsten nitride (WN), and chromium nitride (CrN).

* * * * *